(12) United States Patent
Kahn et al.

(10) Patent No.: US 10,345,463 B2
(45) Date of Patent: Jul. 9, 2019

(54) METHODS AND SYSTEMS FOR USING KNOWN SOURCE EVENTS IN SEISMIC DATA PROCESSING

(71) Applicant: ION Geophysical Corporation, Houston, TX (US)

(72) Inventors: Daniel S. Kahn, Houston, TX (US); Jacques P. Leveille, Houston, TX (US)

(73) Assignee: ION Geophysical Corporation, Houston, TX (US)

( * ) Notice: Subject to any disclaimer, the term of this patent is extended or adjusted under 35 U.S.C. 154(b) by 728 days.

(21) Appl. No.: 14/594,846

(22) Filed: Jan. 12, 2015

(65) Prior Publication Data
US 2015/0241582 A1    Aug. 27, 2015

Related U.S. Application Data

(60) Provisional application No. 61/943,274, filed on Feb. 21, 2014.

(51) Int. Cl.
| G06F 17/10 | (2006.01) |
| G01V 1/28 | (2006.01) |
| G01V 1/30 | (2006.01) |
| G01V 1/34 | (2006.01) |
| G01V 1/40 | (2006.01) |
| G06F 17/50 | (2006.01) |

(52) U.S. Cl.
CPC ............ *G01V 1/282* (2013.01); *G01V 1/288* (2013.01); *G01V 1/30* (2013.01); *G01V 1/345* (2013.01); *G01V 1/40* (2013.01); *G06F 17/10* (2013.01); *G06F 17/5009* (2013.01); *G01V 2210/123* (2013.01); *G01V 2210/41* (2013.01); *G01V 2210/65* (2013.01); *G01V 2210/74* (2013.01)

(58) Field of Classification Search
CPC ....... G06F 17/10; G06F 17/5009; G01V 1/30; G01V 1/40; G01V 1/282; G01V 1/288; G01V 1/345
USPC .................................................. 703/2, 9, 10
See application file for complete search history.

(56) References Cited

U.S. PATENT DOCUMENTS

| 4,596,005 A | * | 6/1986 | Frasier | G01V 1/286 367/38 |
| 7,660,194 B2 | | 2/2010 | Uhl et al. | |
| 2006/0056272 A1 | * | 3/2006 | Hill | G01V 1/282 367/73 |
| 2011/0255371 A1 | * | 10/2011 | Jing | G01V 1/28 367/73 |
| 2017/0075008 A1 | * | 3/2017 | Westerdahl | G01V 1/364 |

FOREIGN PATENT DOCUMENTS

CN      102841373 A      12/2012

OTHER PUBLICATIONS

Daniel S. Kahn (Hydro-Fractured Reservoirs: A Study Using Double-Difference Location Techniques, 2008 (175 pages).*

(Continued)

*Primary Examiner* — Andre Pierre Louis
(74) *Attorney, Agent, or Firm* — Holland & Hart LLP

(57) ABSTRACT

Embodiments of using known source locations in seismic data processing are disclosed. In one embodiment, a method of locating a seismic event includes receiving location information for a plurality of known source events proximate the seismic event, and determining an estimated location of the seismic event using a relative locator constrained by the location information for the plurality of known source events.

35 Claims, 12 Drawing Sheets

(56) References Cited

OTHER PUBLICATIONS

Maxwell, S.C., et al. "Integrated Anisotropic Velocity Modeling Using Perforation Shots, Passive Seismic and VSP Data," EAGE 68th Conference & Exhibition—Vienna, Austria, Jun. 12-15, 2006, A046, Vienna 2006.

Bardainne, T., et al., "Constrained Tomography of Realistic Velocity Models in Microseismic Monitoring Using Calibration Shots," Geophysical Prospecting, 2010, 58, 739-753 EAGE European Association of Geoscientists & Engineers, 10.1111/j.1365-2478.2010.00912.x.

Bardainne, T., et al., "Non-linear Calibration of Complex Velocity Models in Microseismic Jobs," EAGE A03, Workshop on Passive Seismic Limassol, Cyprus, Mar. 22-25, 2009.

Fish, Ashley M., "Microseismic Velocity Inversion and Event Location Using Reverse Time Imaging, Master's Thesis Geophysics," Defended on Aug. 24, 2012, Center for Wave Phenomena, Colorado School of Mines, Golden, CO.

Shabelanski, Andrey H., et al., "Seismic Imaging of Hydraulically-Stimulated Fractures: A Numerical Study of the Effect of the Source Mechanism," SEG Technical Program Expanded Abstracts 2012, Sep. 2012; DOI: 10.1190/segam2012-1182.1.

Warpinski, N.R., et al., "Improved Microseismic Fracture Mapping Using Perforation Timing Measurements for Velocity Calibration," SPE Annual Technical Conference and Exhibition, Oct. 5-8, 2003, Denver, CO, Society of Petroleum Engineers, http://dx.doi.org/10.2118/84488-MS, retrieved Feb. 20, 2014.

Spottiswoode, S.M., et al., "A Hybrid Location Methodology," The Journal of the South African Institute of Mining and Metallurgy, vol. 105 Referred Paper Jul. 2005, pp. 417-426.

Reyes-Montes, J.M., et al., "Application of Relative Location Techniques to Induced Microseismicity from Hydraulic Fracturing," SPE 124620 XP007923211, Annual Technical Conferences, New Orleans, Oct. 4, 2009, pp. 1-8.

Communication Relating to the Results of the Partial International Search for International Application No. PCT/US2015/016289, dated Aug. 28, 2015 from the European patent Office.

\* cited by examiner

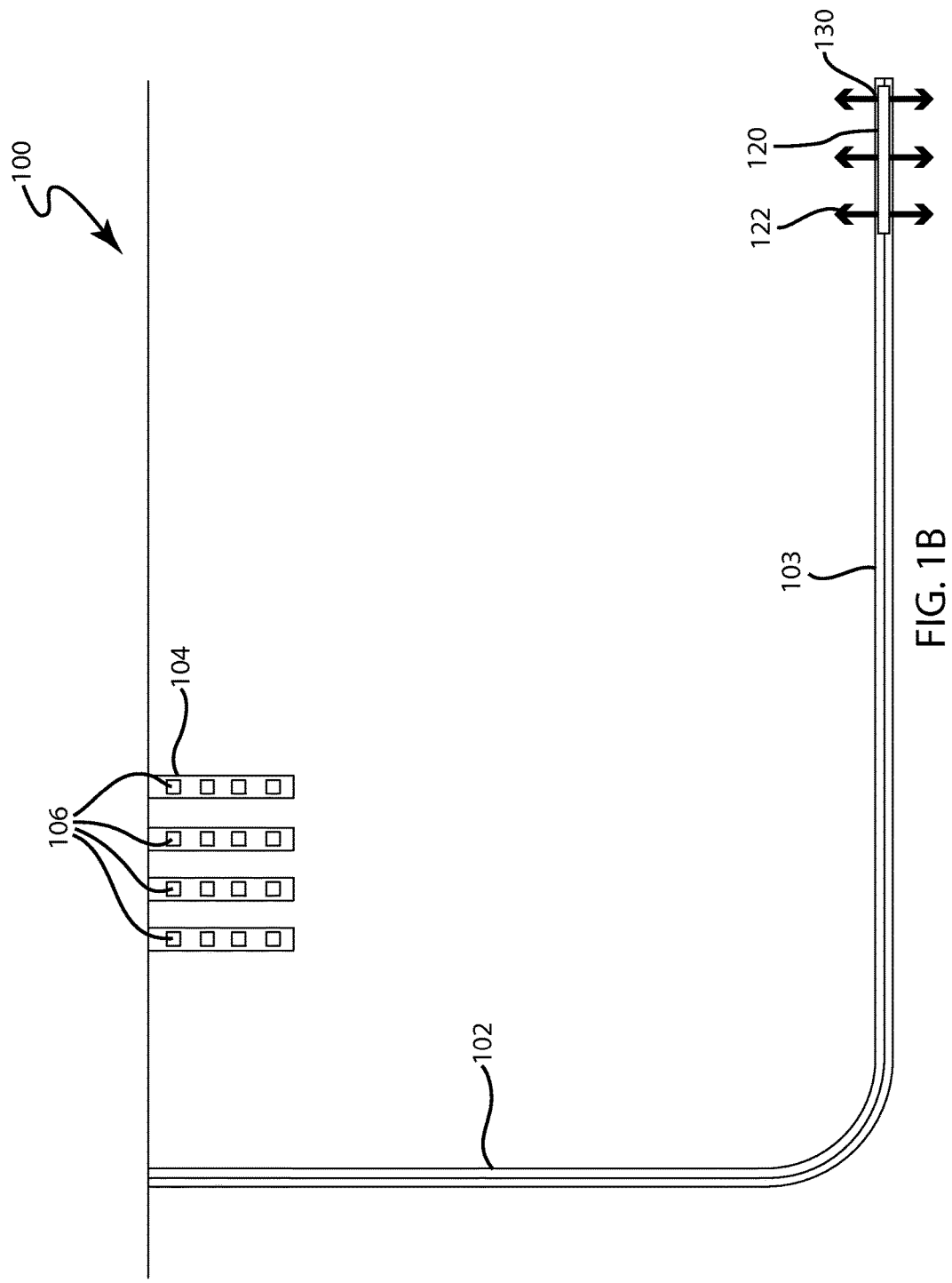

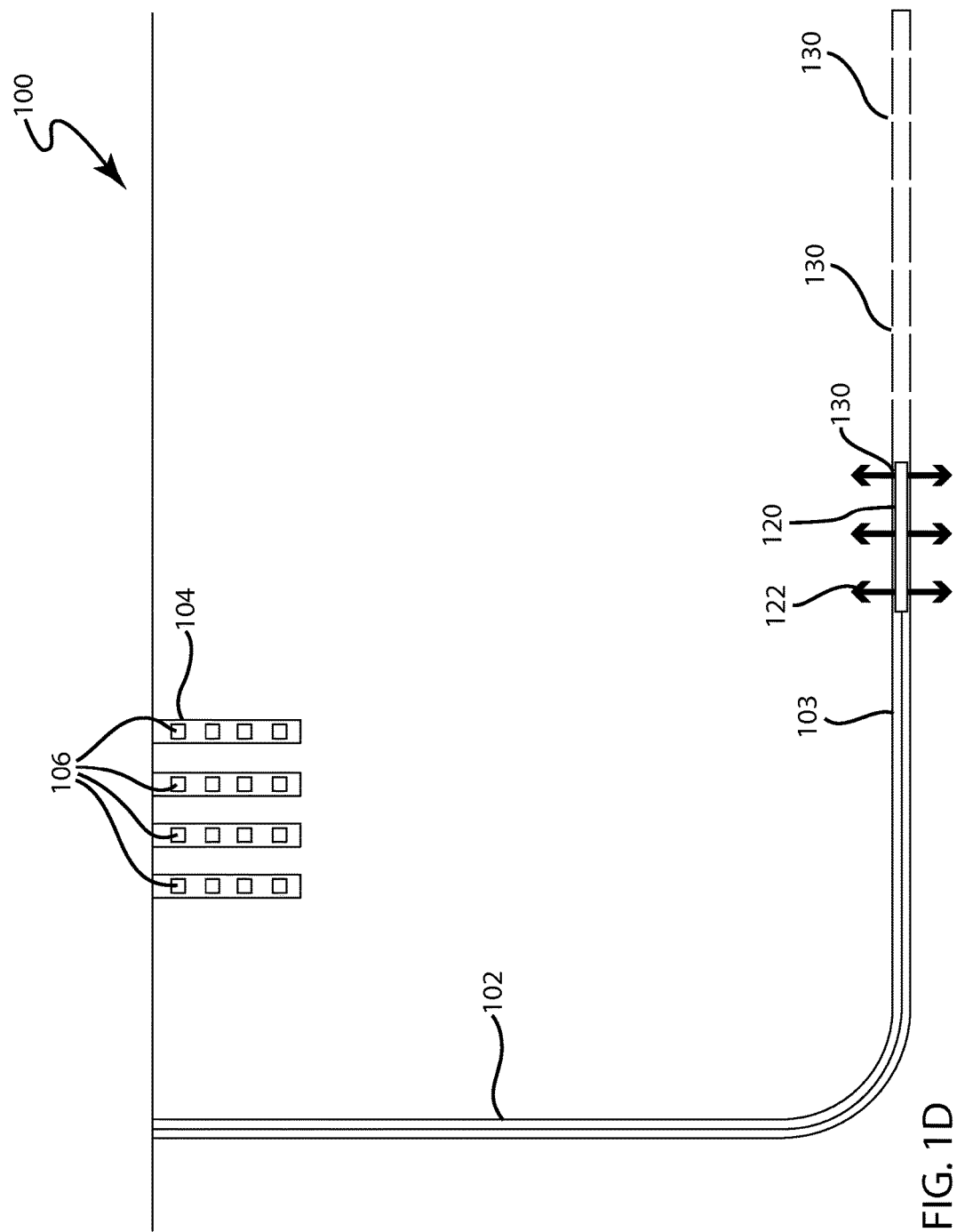

METHODS AND SYSTEMS FOR USING KNOWN SOURCE EVENTS IN SEISMIC DATA PROCESSING

CROSS REFERENCE TO RELATED APPLICATIONS

This application claims priority to and the benefit of U.S. provisional application No. 61/943,274 entitled "Methods and Systems for Microseismic Event Location, Tomography, and Imaging," which was filed on Feb. 21, 2014, and which is hereby incorporated by reference in its entirety for all purposes.

TECHNICAL FIELD

The present disclosure generally relates to seismic data processing, and more particularly to using known source events, such as perforation shots, in seismic data processing.

BACKGROUND

Microseismic monitoring is frequently used to monitor hydraulic fracturing operations in order to provide information about the fracturing of the rocks to scientists and engineers. Such information can be used to control ongoing hydraulic fracturing, to help the scientists and engineers understand the likely resources available after the fracturing, to help design future hydraulic fracturing jobs, and so forth. This type of information can be derived from seismic measurements made on the surface and/or buried below the surface—including for example measurements of the motion of the ground responsive to the hydraulic fracturing. The seismic data, however, needs to be analyzed and processed before it can be useful in understanding the reservoir and the fracturing job. For example, the seismic data may need to be parsed to identify individual seismic events, to locate those events, to develop or refine a velocity model, to create an image of the subsurface, and so forth.

SUMMARY

One example of a method of locating a seismic event may include receiving a picked arrival time corresponding to the seismic event at a sensor location; deriving a calculated travel time for a proposed location corresponding to the seismic event from a velocity model; receiving a plurality of picked arrival times and calculated travel times corresponding to a plurality of known source events proximate the seismic event; and determining an estimated location of the seismic event based on relative differences between the picked arrival time corresponding to the seismic event and the plurality of picked arrival times corresponding to the plurality of known source events, and relative differences between the calculated travel time corresponding to the proposed location of the seismic event and the plurality of calculated travel times corresponding to the plurality of known source events.

In some embodiments, each respective one of the plurality of known source events may be a seismic source event with a respective known location, and the method may further include determining each of the plurality of calculated travel times corresponding to each of the plurality of known source events based on the respective known location of each respective known source event and the velocity model. Also, the known location for each of the plurality of known source events may be determined based on a position of a perforation source within a wellbore, and the position of the perforation source within the wellbore may be determined from a wireline. The respective known location of each respective one of the plurality of known source events may include a three-dimensional subsurface position and an origin time, and the three-dimensional subsurface position and origin time may be known to within a specified accuracy.

In some embodiments, at least some of the plurality of known source events may be perforation shots in a wellbore casing, and/or the plurality of known source events may include three or more perforation shots.

In some embodiments, the estimated location of the seismic event may be determined by reducing a difference between (a) the relative differences between the calculated travel time for the proposed location corresponding to the seismic event and the plurality of calculated travel times corresponding to the plurality of known source events, and (b) the relative differences between the picked arrival time corresponding to the seismic event and the plurality of picked arrival times corresponding to the plurality of known source events. Reducing the difference may include iteratively updating the proposed location corresponding to the seismic event. The proposed location corresponding to the seismic event may be iteratively updated until a change between successive iterations of said difference is less than a predetermined threshold. The proposed location corresponding to the seismic event may be iteratively updated until said difference is reduced to below a predetermined threshold. The picked arrival time corresponding to the seismic event at the sensor location may be received in near-real time, and the estimated location of the seismic event may be determined in near-real time. Also, the picked arrival time may be one of a plurality of picked arrival times and the seismic event may be one of a plurality of seismic events, with the estimated location of the one of the plurality of seismic events being determined without reference to the picked arrival times for others of the plurality of seismic events.

Another example of a method of locating a seismic event may include receiving location information for a plurality of known source events proximate the seismic event, and determining an estimated location of the seismic event using a relative locator constrained by the location information for the plurality of known source events.

In some embodiments, the relative locator may be a double difference locator. Also, the method may further include clustering the seismic event together with the plurality of known source events for use by the relative locator. The estimated location of the seismic event may include an estimated origin time and an estimated three-dimensional subsurface position. The plurality of known source events may include a first set of known source events associated with a first stage of perforating a hydraulic fracturing well and a second set of known source events associated with a second stage of perforating a hydraulic fracturing well. Also, the method may further include determining the estimated location of the seismic event by interpolating between the first and second sets of known source events.

One example of a method of updating a velocity model may include receiving a plurality of picked arrival times corresponding to a respective plurality of known source events, deriving a plurality of calculated travel times corresponding to the plurality of known source events from an initial velocity model, and updating the initial velocity model based on relative differences between the plurality of picked arrival times and relative differences between the plurality of calculated travel times.

In some embodiments, the plurality of calculated travel times may be calculated with reference to a slowness field of the initial velocity model, and the initial velocity model may be updated by iteratively adjusting the slowness field to reduce the a difference between (a) relative differences between the plurality of picked arrival times and (b) the relative differences between the plurality of calculated travel times. At least some of the plurality of known source events may be perforation shots in a wellbore casing, whose three-dimensional subsurface position and origin time are known. Each of the plurality of known source events may be no further than 20 meters away from each of the other of the plurality of known source events. Also, each of the plurality of known source events may be associated with a known three-dimensional subsurface position and origin time, and the known three-dimensional subsurface position and origin time for each of the plurality of known source events may not varied during said updating. Each respective one of the plurality of calculated travel times corresponding to each respective one of the plurality of known source events may be calculated based on the known three-dimensional subsurface position and origin time for the respective one of the plurality of known source events and the initial velocity model.

In some embodiments, the method may further include determining an estimated location of a seismic event using the updated velocity model, and may also include further updating the velocity model based on the determined location of the seismic event. The plurality of known source events may be a first plurality of known source events triggered during a first stage of perforating a hydraulic fracturing well, and the method may further include receiving a second plurality of picked arrival times corresponding to a second plurality of known source events triggered during a second stage of perforating a hydraulic fracturing well, deriving a second plurality of calculated travel times corresponding to the second plurality of known source events, and further updating the velocity model based on relative differences between the second plurality of picked arrival times and relative differences between the second plurality of calculated travel times.

One example of a method of imaging a subsurface region includes receiving a location, a picked arrival time, and a calculated travel time for each of a plurality of known source events proximate a seismic event, receiving one or more seismic traces corresponding to a sensor location, initiating energy propagation from the location of each respective one of the plurality of known source events based on relative differences between the picked arrival times for the plurality of known source events and observed travel times corresponding to the one or more seismic traces and also based on relative differences between the calculated travel times for the plurality of known source events and calculated travel times corresponding to the one or more seismic traces, and identifying subsurface reflectors based on said energy propagation.

In some embodiments, said identifying may include imaging said subsurface reflectors. Also, the subsurface reflectors may be identified by overlapping energy propagating from multiple ones of the plurality of known source events. The sensor location may be near an air-land or air-water boundary, distant from the seismic event, and/or distant from each of the plurality of known source events.

In some embodiments, at least a first of the plurality of known source events may be a perforation shot, and a second of the plurality of known source events may be a seismic event whose location is known to within a specified certainty. The energy propagation may be done using a Kirchhoff migration technique, and/or energy in the one or more seismic traces may be propagated using wave equation propagators. In some embodiments, an estimated velocity model may constrain the energy propagation. Also, the plurality of known source events may include at least four non-coplanar known source events.

Also, systems, apparatuses, and computer readable mediums for implementing the above-described methods are contemplated.

BRIEF DESCRIPTION OF THE DRAWINGS

FIGS. 1B to 1E are simplified diagrams illustrating the perforation of a hydraulic fracturing well in multiple stages.

DETAILED DESCRIPTION

Figure 1A:
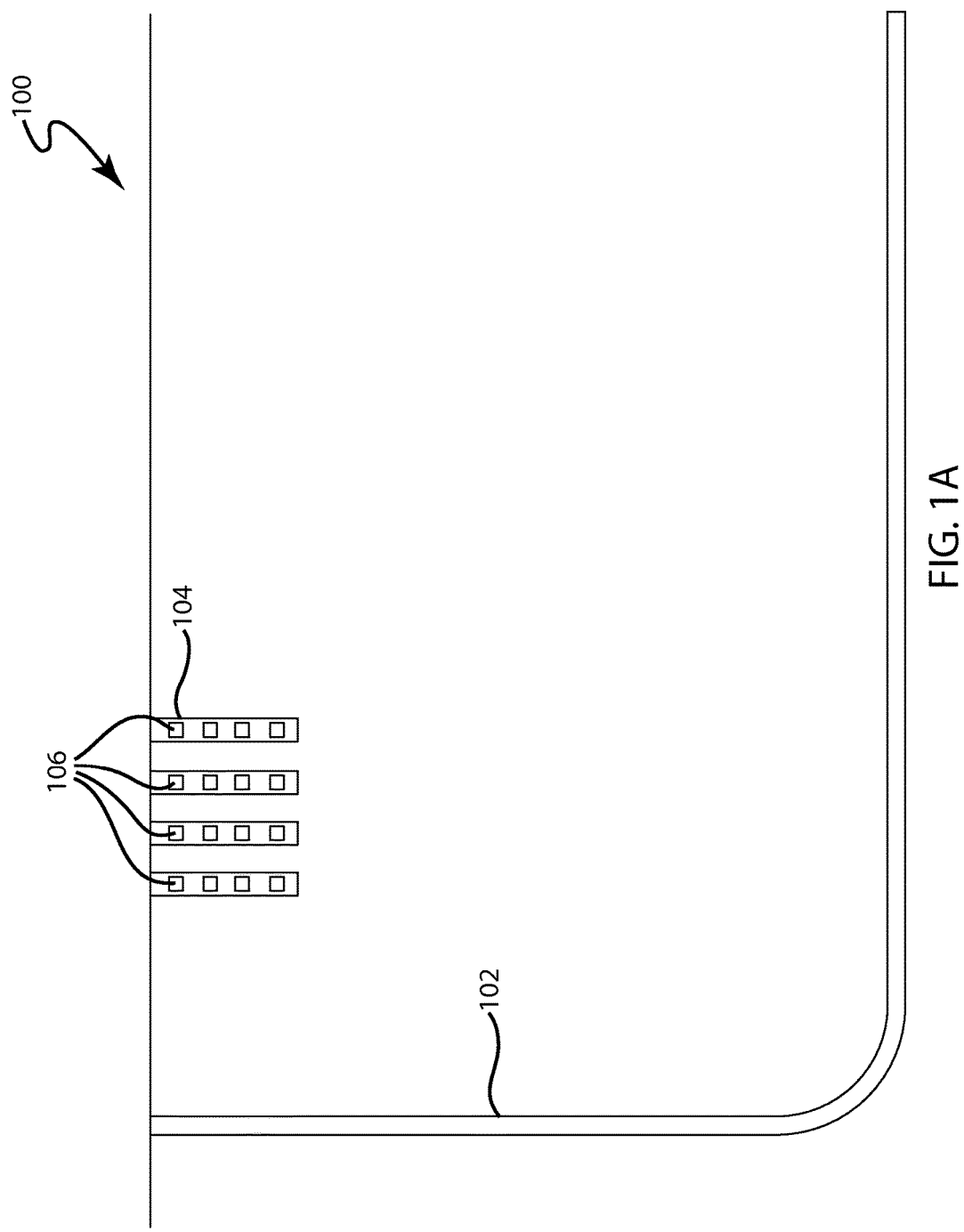
FIG. 1A is a simplified diagram of a seismic monitoring operation during, for example, a hydraulic fracturing job.

FIG. 1A illustrates a seismic monitoring system 100. The system 100 includes a hydraulic fracturing well 102, along with a plurality of monitoring wells 104 (which may be referred to as boreholes). Each monitoring well 104 includes a plurality of sensor stations 106 (e.g., geophones, accelerometers, etc.), which may be spaced for example 20 meters apart. The monitoring wells 104 may also be spaced 20 meters apart in some embodiments. Once the sensors 106 are positioned in the monitoring wells 104, the wells 104 are usually filled in to help provide good coupling between the ground and the sensors 106. It should be noted that in some embodiments, instead of monitor wells, the sensors 106 may be spread out in a grid on the surface above the fracturing well 102. In still other embodiments, a single monitoring well 104 may be used, or a plurality of monitoring wells 104 may be used, as illustrated in FIG. 1A. In those instances in which multiple monitoring wells 104 are used, the monitoring wells 104 may form a grid over an area of interest, or they may only form a line of wells 104 at a specific region near the hydraulic fracturing well 102. Furthermore, while reference is generically made herein to seismic events, it will be understood that the concepts and disclosure may also apply many types of endeavors—including hydraulic fracturing microseismic monitoring, non-hydraulic fracturing microseismic monitoring, active source seismic prospecting (including on land or at sea), earthquake seismology, and so forth.

FIGS. 1B to 1E are simplified diagrams illustrating the perforation of a hydraulic fracturing well in multiple stages, such as the well 102 illustrated in FIG. 1A. During the creation and preparation of an operational hydraulic fracturing well 102 (and similarly for other types of oil and gas wells), a cement casing 103 may need to be perforated in order to allow the fracturing fluid to be expelled into the surrounding subsurface, and also to allow oil and gas to return to the wellhead. Typically, one or more long, narrow perforating guns 120 are lowered into the well 102, and explosives 122 are used to perforate the casing 103 at preselected locations. In some cases, the perforating guns 120 are moved along the horizontal portion of the well to perforate the casing 103 in multiple stages.

For example, in FIG. 1B, a perforating gun 120 is positioned near the end of the horizontal portion of the well 102, and explosives 122 are activated to perforate the casing 103 in a first stage, leaving perforations 130 in the casing 103. The position of the perforating gun(s) may be known to a high accuracy from, for example, a wireline truck. Positioning the perforating gun at the correct position within the well 102 may be important to have the best chance of creating a profitable well. Therefore, significant effort may be expended in deciding the best location to perforate, and accurate positioning tools may be used to ensure that the perforating gun(s) are correctly positioned so as to obtain the intended benefits from the well 102.

Figure 1C:
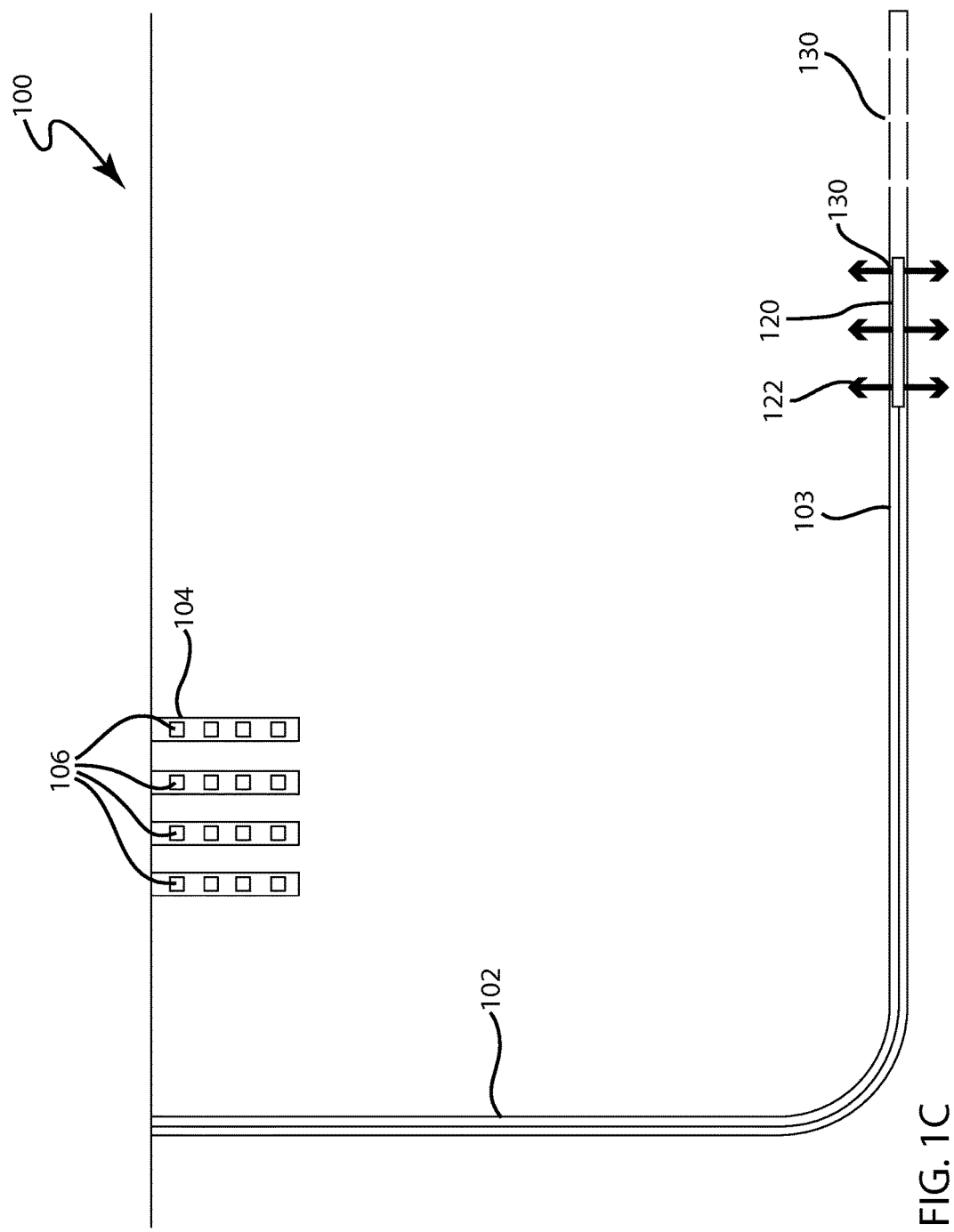

As illustrated in FIG. 1C, in a second stage of perforation, the perforating gun 120 is positioned again within the well 102, offset from the first position in the first stage of perforation, and explosives 122 are again activated to perforate the casing 103 in a second stage, leaving additional perforations 130 in the casing. Similarly, in FIG. 1D, in a third stage of perforation, the perforation gun 120 is positioned within the well 102, offset from the first and second positions in the first and second stages of perforation, and explosives 122 are again activated to perforate the casing 103 in a third stage.

Figure 1E:
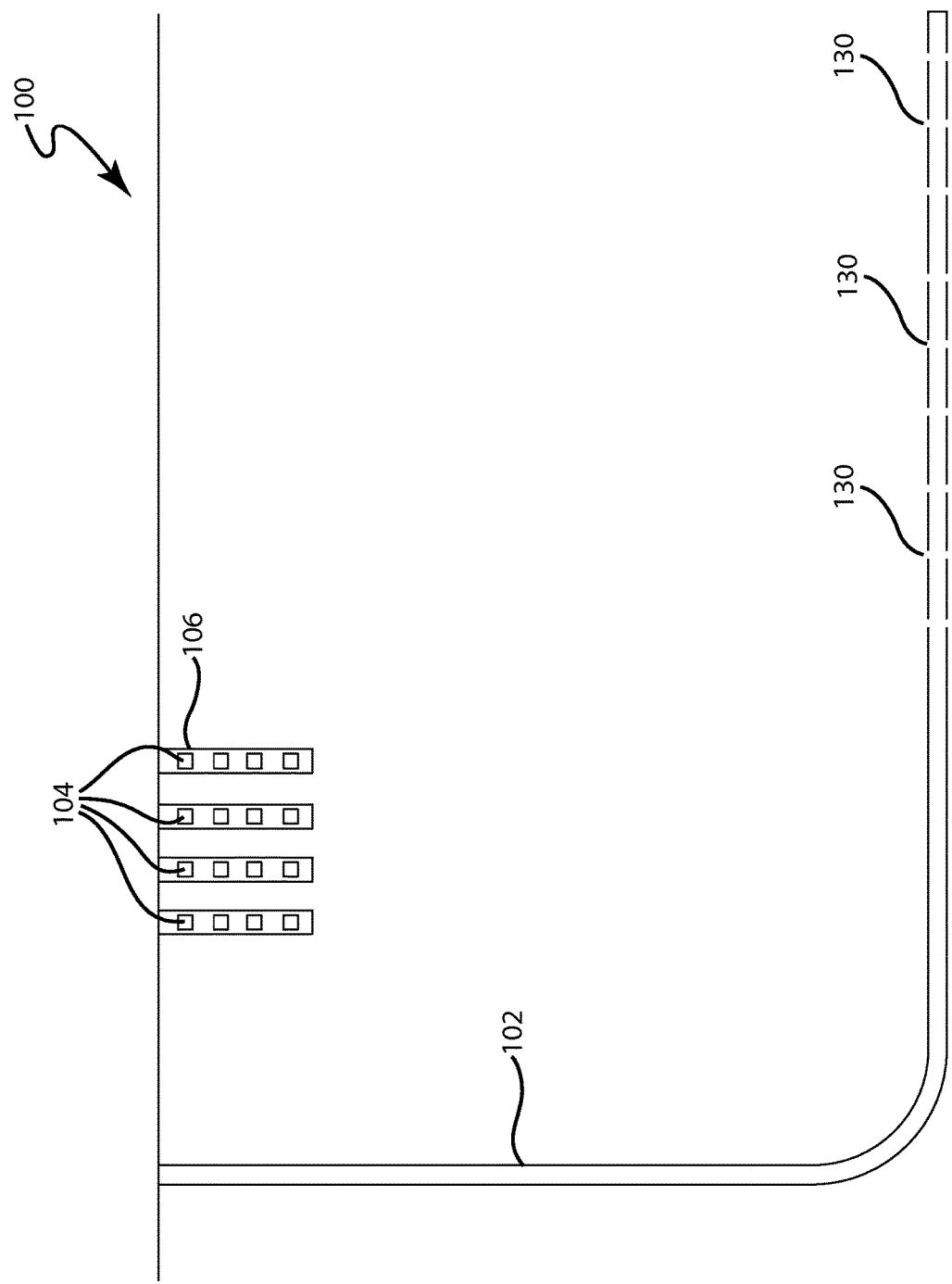

FIG. 1E shows the well 102 with a plurality of perforations 130, after all of the stages of perforation are complete. It will be appreciated that after the activation of the explosives in each of the stages, additional steps may be taken before the explosives are activated in the subsequent stage. For example, the perforating gun(s) may be removed, and hydraulic fracturing fluid may be injected into the well to fracture the rock surrounding the perforations 130 in the first stage. A plug may then be installed to block off the first stage of the well 102, and the perforating gun(s) again lowered to conduct the second stage of perforation. Alternatively, in some embodiments, two or more stages of perforation may be completed prior to injecting the hydraulic fracturing fluid into the well 102.

As explained in further detail below, the perforation shots fired by the perforating gun(s) 120 as the explosives 122 are activated are known seismic sources that can be used to improve the accuracy and results of seismic data processing for areas proximate the perforation shots. More specifically, the location of the perforation shots, the magnitude of the shots, and the times at which they are fired can generally be known to a high degree of accuracy. If seismic sensors, such as the sensors 106 illustrated in FIGS. 1A through 1E, are positioned prior to the perforation shots, they can record data corresponding to the perforation shots. Correlating the location, magnitude, and time information from the perforation shots with the sensed seismic signals at the sensors 106 can provide valuable information about the subsurface proximate the perforation shots that can be used in subsequent seismic data processing. For example, this information can be used to improve the accuracy of processing seismic data acquired during the fracturing stage of the well, as well as the accuracy of processing seismic data acquired during operation of the well to monitor the reservoir.

While the above description has focused on using perforating guns to create known source events in the well 102, in other examples, other mechanisms may be used. For example, the casing 103 of the well 102 may be perforated using something other than perforating guns with explosive, and/or other seismic events may be induced in the well 102 at known locations to create known source events.

Figure 2:
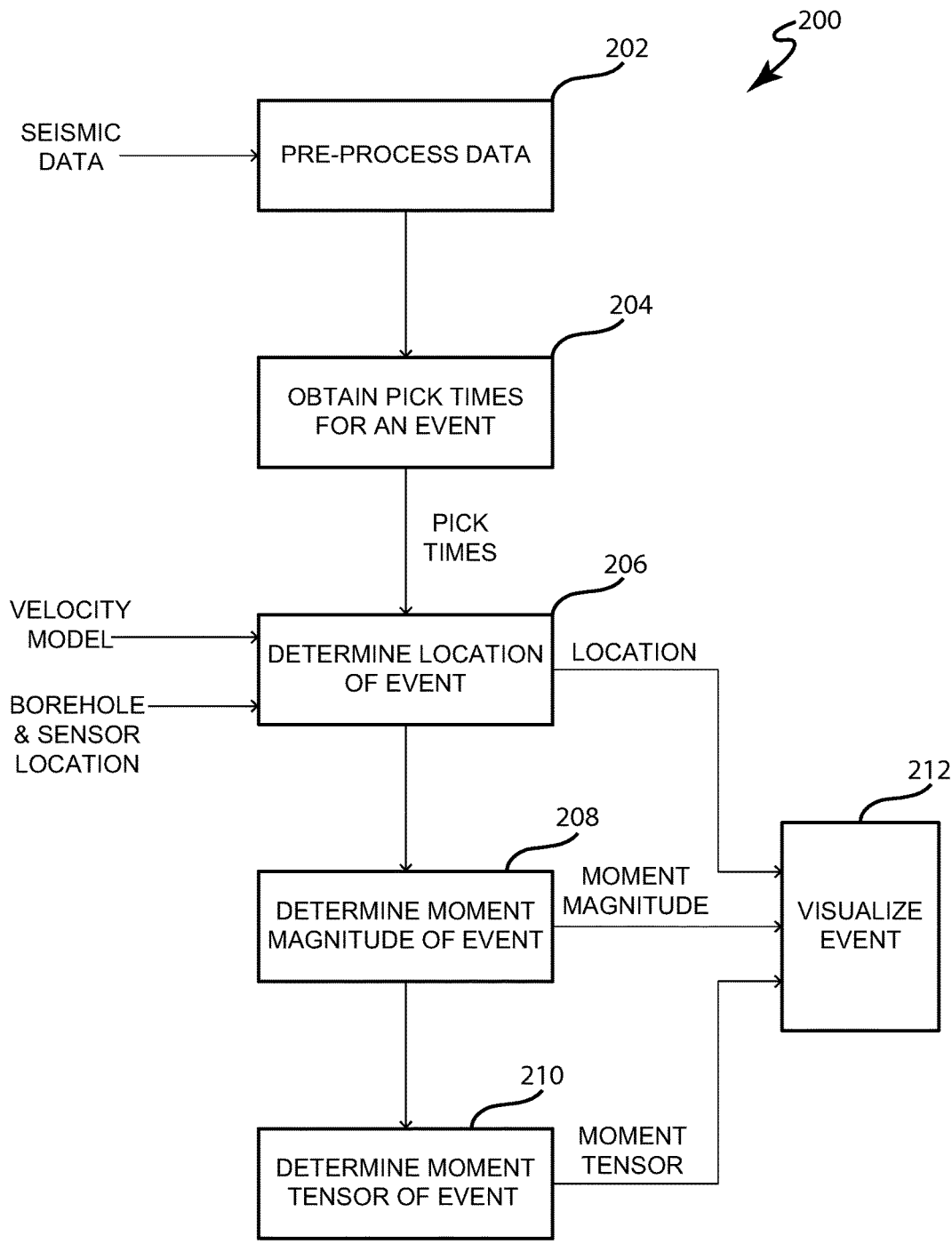
FIG. 2 is a flowchart illustrating a method for analyzing seismic events.

Referring now to FIG. 2, an overview of one method 200 to analyze one or more seismic events is shown. The method 200 may be carried out in near-real time during, for example, a hydraulic fracturing job. The method 200 shown in FIG. 2 is intended as an overview, and specific details regarding certain steps will be described in more detail below.

In operation 202, seismic data may be received and pre-processed. The seismic data may be motion and/or pressure measurements from one or more sensors, such as geophones, accelerometers, hydrophones (in a marine environment), and so forth. The sensors may be positioned in one or more monitoring well boreholes, which may be spread across the surface of the earth proximate an area of interest, towed behind a vessel, etc. Pre-processing the data may include rotating motion measurements, removing noise, stacking, and other processing steps.

In operation 204, pick times for one or more seismic events may be determined Pick times may be determined by an automated process that analyzes neighboring traces to find a common event using semblance or cross-correlation techniques in some embodiments. The pick times, together with a velocity model and the physical locations of the sensors (including, where relevant, the locations of the monitoring well boreholes) may be used to determine the location of the event in operation 206. The location of the event may include its three-dimensional subsurface position (x, y, and z coordinates) and also the time at which the event occurred. The time at which the event occurred may be referred to as an origin time, and may be relative. In operations 208 and 210, the moment magnitude and moment tensor associated with each event may be determined, and in operation 212, the location, the moment magnitude, and/or the moment tensor may be used to visualize the event.

The method 200 may be repeated for many events and/or many events may proceed through operations 202-212 in parallel. In various embodiments, the operations 202-212 need not all be done, or may only be done for certain events (such as perforation shots). For example, in some embodiments of the present disclosure, seismic traces from the sensors 106 may be migrated to form an image, without necessarily obtaining pick times, determining the moment magnitude and tensor, and/or without visualizing the event.

Figure 3:
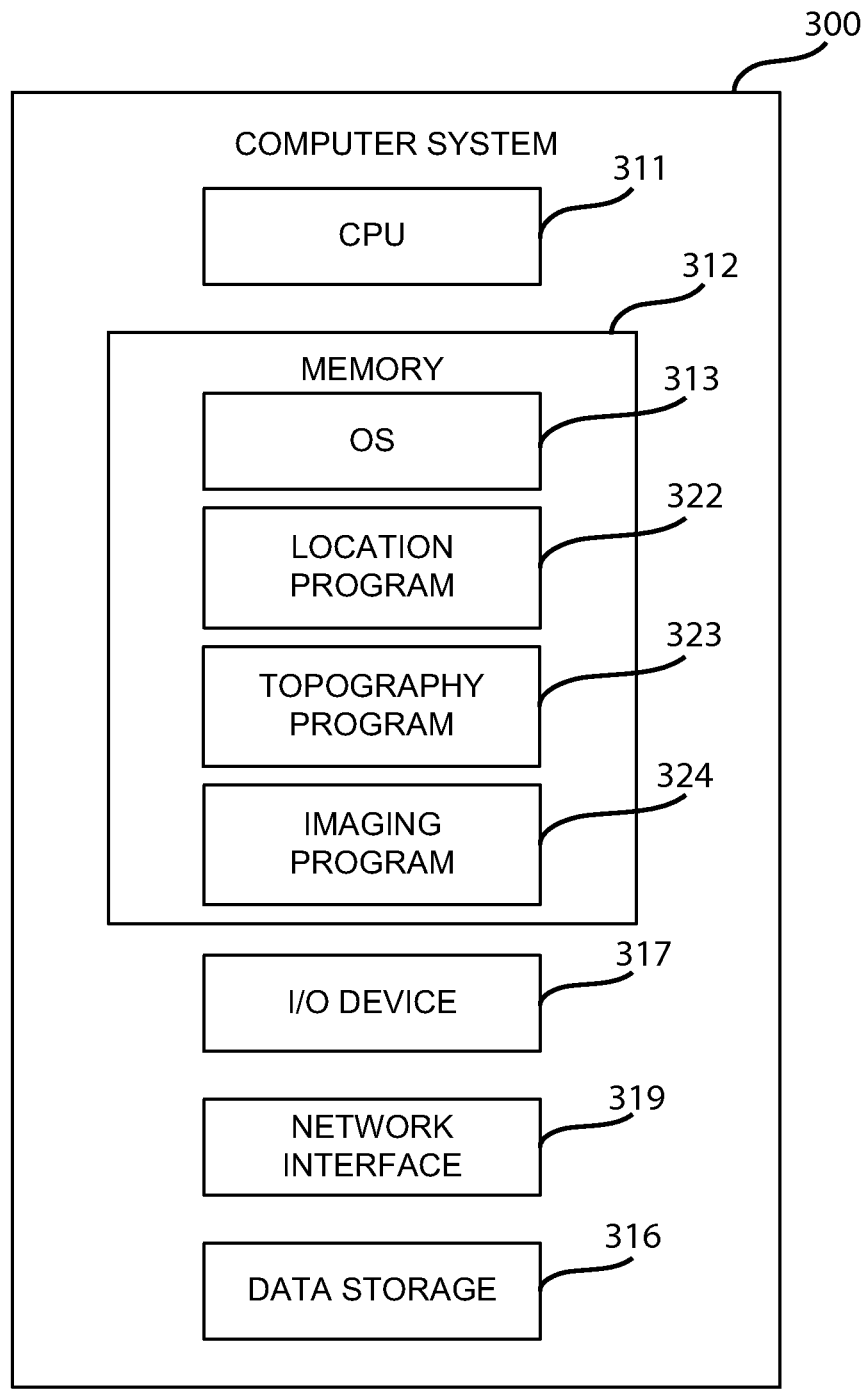
FIG. 3 is a simplified block diagram of a computer system which may be used to implement various embodiments of the present disclosure.

FIG. 3 illustrates an exemplary computer system 300, which may be used to perform one or more of the operations in method 200, as well as the operations in the methods described below. As illustrated in FIG. 3, the computer system 300 may include at least one Central Processing Unit (CPU) 311, a memory 312, data storage 316, input/output device 317, and network interface device 319. While a single CPU 311 is shown in FIG. 3, in alternative embodiments, a plurality of CPUs may be implemented within the computer system, or multiple computer systems may be combined as a processing cluster.

The input/output device 317 may include devices such as a mouse, keyboard, trackball, stylus pen, touchscreen, display (e.g., computer monitor), and the like. The network interface device 319 may be any entry/exit device configured to allow network communications between the computer system 300 and another device, e.g., another computer system, a server, and the like. In one embodiment, the network interface device 319 may be a network adapter or other network interface card (NIC).

Data storage 316 may be a Direct Access Storage Device (DASD). Although it is shown as a single unit, it could be a combination of fixed and/or removable storage devices, such as fixed disc drives, floppy disc drives, tape drives, removable memory cards, or optical storage. The memory 312 and data storage 316 could be part of one virtual address space spanning multiple primary and secondary storage devices.

The memory 312 may be a random access memory that is sufficiently large to hold the necessary programming and data structures of the invention. While memory 312 is shown as a single entity, it should be understood that memory 312 may in fact comprise a plurality of modules, and that memory 312 may exist at multiple levels, from high speed registers and caches to lower speed but larger DRAM chips. Illustratively, the memory 312 may include an operating system 313. Any operating system supporting the functions disclosed herein may be used.

Memory 312 may also include a location program 322, a tomography program 323, and/or an imaging program 324, any one of which may be executed by CPU 311 to enable the use of known source events in seismic data processing, several examples of which are given below.

Locating Seismic Events

Figure 4:
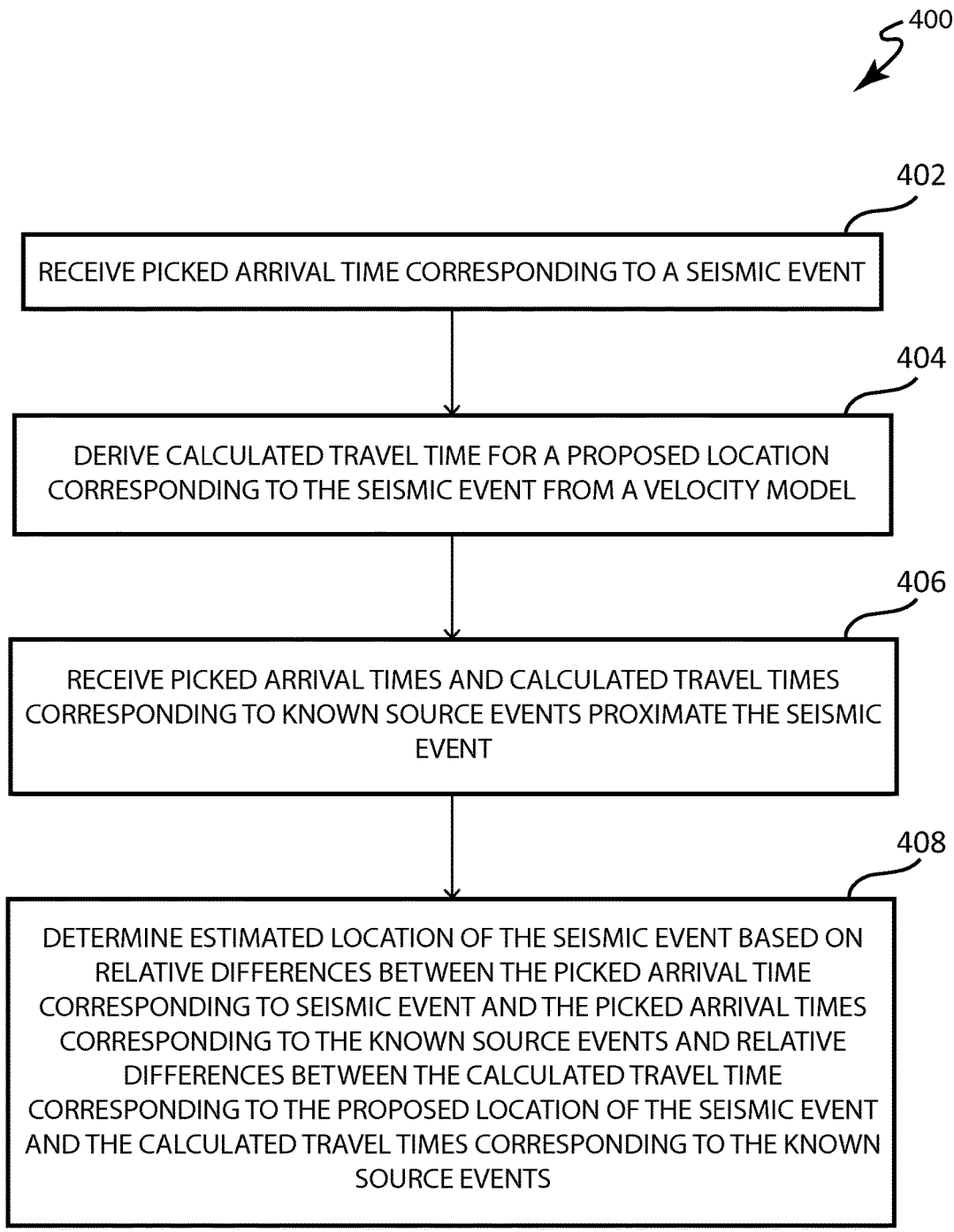
FIG. 4 is a flowchart illustrating one embodiment of a method of locating a seismic event.
Figure 5:
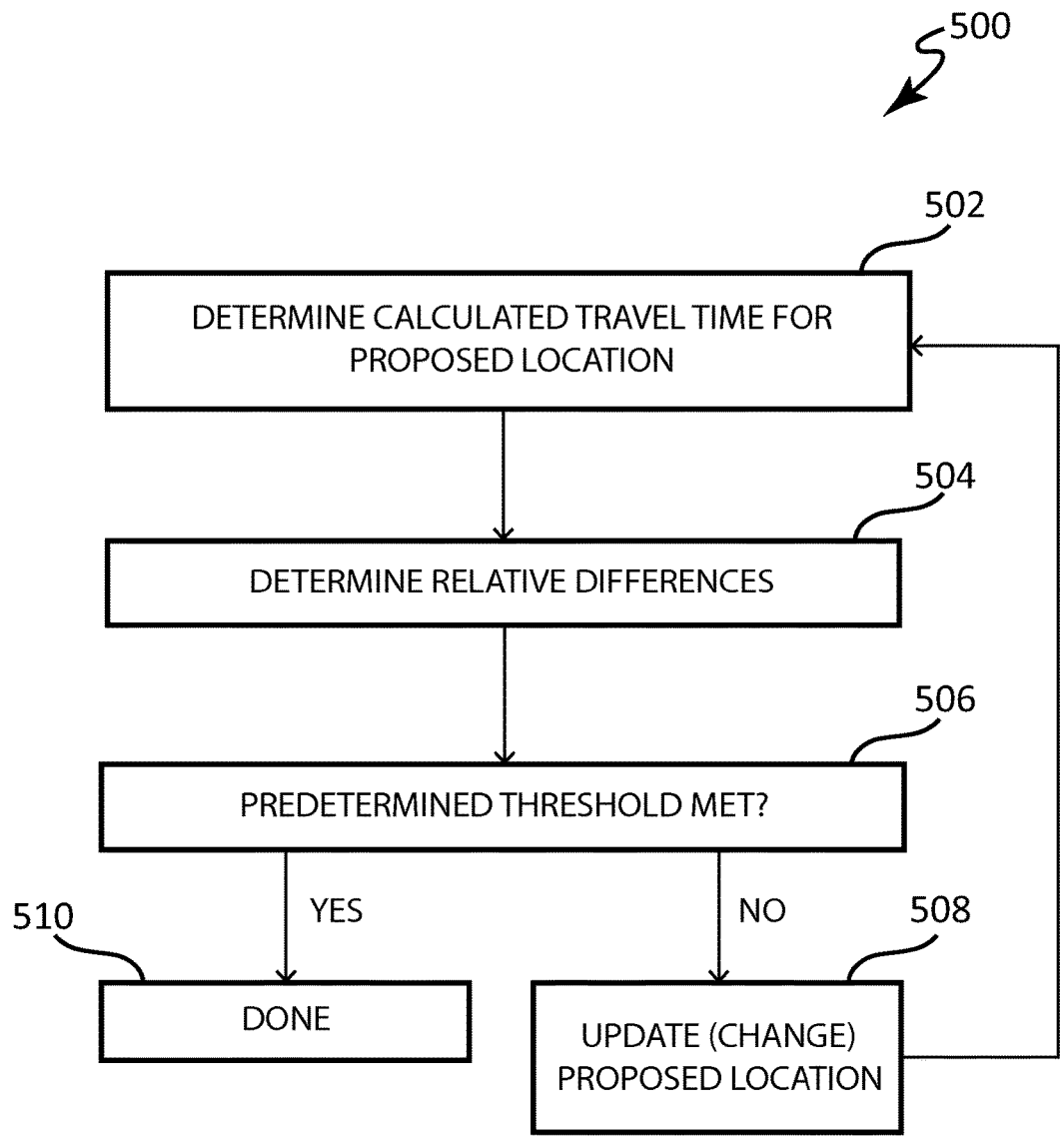
FIG. 5 is a flowchart illustrating another embodiment of a method of locating a seismic event.
Figure 6:
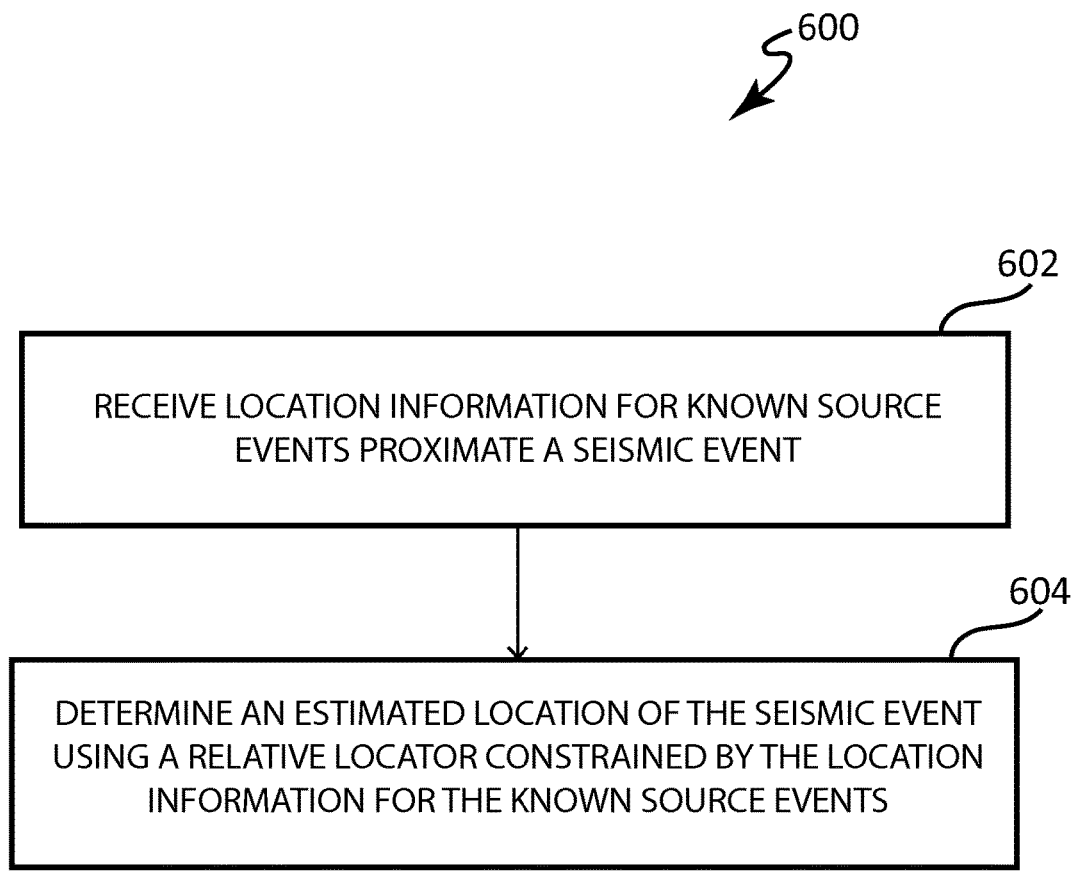
FIG. 6 is a flowchart illustrating another embodiment of a method of locating a seismic event.

Referring now to FIGS. 4 through 6, embodiments for determining the location of a seismic event (e.g., operation 206 in the method 200 shown in FIG. 2) will now be described. One or more of the embodiments described with reference to FIGS. 4 through 6 may be implemented in the location program 322 shown in FIG. 3.

Conventional techniques for locating seismic events generally fall into two categories: 1) absolute locators, which locate events with respect to fixed coordinates but are subject to errors in the velocity model, and 2) relative locators, which locate events with respect to each other. While relative locators tend to cancel the errors in the velocity model, they typically can only be used after many events have been gathered, and therefore cannot provide real time data or data on a per event basis. The methods illustrated in FIGS. 4 through 6, however, use one or more known source events (such as perforation shots) together with a seismic event to be located in a relative locator.

The use of the relative locator (such as a double difference locator) together with the known source event locations may help reduce the dependence on the velocity model (e.g., by cancelling out velocity model errors) in the location of a seismic event because the seismic event is clustered together with the known source events in the double difference locator method. The double difference location technique thus provides the cancellation of the velocity model errors, while the known locations of the known source events causes the relative locations usually obtained from a double difference locator to be positioned correctly in fixed coordinate space. In other words, by minimizing the double differences of the seismic event relative to the known source event locations, absolute positions of the seismic event may be obtained without the velocity model errors typically found in absolute locators.

Referring now to the method 400 of locating a seismic event illustrated in FIG. 4, a picked arrival time corresponding to a seismic event at a sensor location is received in operation 402. The seismic event may be, for example, an event associated with the hydraulic fracturing of the well, and therefore its location may be unknown, with its location being defined by a two- or three-dimensional subsurface position and origin time. It may be desirable to locate the event in order to better understand the hydraulic fracturing process of the well, and to guide future hydraulic fracturing, for example. The sensor location may be any of the locations of the sensors 106 described above with reference to FIG. 1A—for example, the sensor location may be in a buried array of sensors, a surface sensor array, a single seismic sensor, and so forth. The arrival time may be 'picked' based on analysis of a seismic data trace recorded at the sensor location, and may represent an estimated time at which a seismic wave from the seismic event reached the sensor location.

The picked arrival time in operation 402 may be received in near-real time (e.g., within 0.1, 1, 5, 10, 20, 30, 60, or 120 minutes after the occurrence of the seismic event) in some embodiments, which may allow the estimated location of the seismic event to be determined in near-real time, as described below with reference to operation 408.

In operation 404, a calculated travel time for a proposed location corresponding to the seismic event is derived from a velocity model. Using the picked arrival time for the seismic event, together with an estimated velocity model, one or more possible locations for the seismic event may be proposed. For each proposed location, a travel time is calculated using the velocity model—with the travel time representing the time that a seismic wave would take to arrive at the sensor location if it originated at the proposed location, based on the expected propagation of the wave as determined by the velocity model.

In operation 406, a plurality of picked arrival times and calculated travel times corresponding to a plurality of known source events proximate the seismic event are received. The source events are "known" in that each event has a "known" location. The "known" location may include a two- or three-dimensional subsurface position and origin time known to within a specified accuracy. One or more of the known source events may be perforation shots in a wellbore casing—for example, the plurality of known source events may be three or more perforation shots. In other embodiments, however, other known source events may be used, such as a seismic vibrator lowered into the well and activated to generate a seismic sweep.

The picked arrival times corresponding to the plurality of known source events may be obtained in a similar manner as the picked times corresponding to a seismic event of unknown location, as per operation 402. Specifically, the picked arrival times for the known source events may be obtained by using a picking software program, or by visually inspecting a seismic trace to identify approximately when the resulting seismic wave from the known source event reached one or more sensor locations. Similarly, the calculated travel times corresponding to each of the plurality of known source events may be determined, as in operation 404, based on the velocity model. However, the calculated travel times are also based on the respective known location of the respective known source event. Because the location (position and origin time) of each known source event is already known, the calculated travel time, based on the velocity model, can be determined to a relatively high accuracy.

In some embodiments, the picked arrival times and calculated travel times corresponding to the plurality of known source events proximate the seismic event are determined in advance of the occurrence of the seismic event—that is, operation 406 may be performed prior to operations 402 and 404. In this manner, the method 400 may be used to determine the estimated location of the seismic event in near real time or in real time. Generally speaking, the operations in the method 400 may be performed in any appropriate order.

In operation 408, an estimated location of the seismic event is determined based on relative differences between the picked arrival time corresponding to the seismic event and the plurality of picked arrival times corresponding to the plurality of known source events, and/or based on relative differences between the calculated travel time corresponding to the proposed location of the seismic event and the plurality of calculated travel times corresponding to the plurality of known source events.

In some embodiments, the following double difference equation may be used to calculated the relative differences between the picked arrival time corresponding to the seismic event and the plurality of picked arrival times corresponding to the plurality of known source events, and/or the relative differences between the calculated travel time corresponding to the proposed location of the seismic event and the plurality of calculated travel times corresponding to the plurality of known source events:

$$dr_k^{ij} = (t_k^i - t_k^j)^{obs} - (t_k^i - t_k^j)^{cal} \qquad \text{Equation 1}$$

where $dr_k^{ij}$ is defined as a double difference, $(t_k^i - t_k^j)^{obs}$ is the relative difference between the picked (or observed) arrival times corresponding to events i and j at sensor location k, and $(t_k^i - t_k^j)^{cal}$ is the relative difference between the calculated travel times corresponding to events i and j at sensor location k. It will be appreciated that Equation 1 can be used to determine the double difference between two events—such as a seismic event in question and one known source event. In order to calculate multiple double differences when relative differences between more than two events are to be calculated, Equation 1 may be repeated for each pair of events to be differenced. In some embodiments, and as described below with reference to the method 500 illustrated in FIG. 5, matrices may be used to calculate the double difference for all of the pairs of events.

Still referring to operation 408, in one embodiment, the estimated location may be determined by reducing (e.g., minimizing) a difference between (a) the relative differences between the calculated travel time for the proposed location corresponding to the seismic event and the plurality of calculated travel times corresponding to the plurality of known source events, and (b) the relative differences between the picked arrival times corresponding to the seismic event and the plurality of picked arrival times corresponding to the plurality of known source events.

In some embodiments, a plurality of picked arrival times corresponding to a plurality of "unknown" different seismic events may be received in operation 402 (or in multiple instances of operation 402). However, the estimated location of each seismic event in operation 408 may be determined without reference to the picked arrival times of other "unknown" seismic events. In other words, the method 400 may consider each such seismic event in isolation from the other seismic events, and instead may cluster each seismic event to be located with one or more known source events for use in a double difference locator as described herein. In these embodiments, the well 102 may be monitored in near-real time because seismic events can be analyzed one-by-one as they happen, rather than needing to wait to receive information about all of the seismic events to be located for consideration together. Nonetheless, in other embodiments, two or more "unknown" seismic events to be located may be considered together to further improve the location process.

The difference between the relative differences of the picked arrival times and the relative differences of the calculated travel times may be reduced (e g, minimized) by iteratively updating the proposed location corresponding to the seismic event, as explained in more detail now with reference to FIG. 5.

In operation 502 of the method 500 illustrated in FIG. 5, the calculated travel time for the proposed location of the seismic event is determined, similar to operation 404 in FIG. 4. In operation 504, relative differences (such the relative differences described in operation 408) are determined, and in operation 506, a check is made as to whether a predetermined threshold has been met. If the predetermined threshold has not been met in operation 506, the method continues to operation 508, where the proposed location for the seismic event is updated (changed). The proposed location for the seismic event may be updated (changed) based on, for example, the relative differences described above with reference to operation 408 in method 400. Returning to FIG. 5, however, the method 500 then begins again by determining calculated travel times for the newly updated proposed location. If the predetermined threshold has been met in operation 506, then the method proceeds to operation 510, where no further updating is done, and the most recent update to the proposed location (e.g., the most recent operation 508) is used as the location of the seismic event.

The predetermined threshold in operation 506 may be one of several different thresholds. For example, in one embodiment, the method 500 is used to iteratively update the proposed location until a change between successive iterations of the difference between the relative differences is less than a predetermined threshold. As another example, the method 500 may be used to iteratively update the proposed location until the difference between successive locations is below a predetermined threshold—for example 5 meters.

In some embodiments, as mentioned above, matrices may be used to compute the double differences between each pair of events, and to facilitate the iterative updating of the proposed location in method 500. For example, the following matrix equation may be used in the method 500:

Equation 2

$$\begin{pmatrix} \frac{\partial t}{\partial x} & \frac{\partial t}{\partial y} & \frac{\partial t}{\partial z} & 1 & -\frac{\partial t}{\partial x_{p1}} & -\frac{\partial t}{\partial y_{p1}} & -\frac{\partial t}{\partial z_{p1}} & -1 & 0 & 0 & 0 & 0 & 0 & 0 & 0 & 0 \\ \frac{\partial t}{\partial x} & \frac{\partial t}{\partial y} & \frac{\partial t}{\partial z} & 1 & 0 & 0 & 0 & 0 & -\frac{\partial t}{\partial x_{p2}} & -\frac{\partial t}{\partial y_{p2}} & -\frac{\partial t}{\partial z_{p2}} & -1 & 0 & 0 & 0 & 0 \\ \frac{\partial t}{\partial x} & \frac{\partial t}{\partial y} & \frac{\partial t}{\partial z} & 1 & 0 & 0 & 0 & 0 & 0 & 0 & 0 & 0 & -\frac{\partial t}{\partial x_{p3}} & -\frac{\partial t}{\partial y_{p3}} & -\frac{\partial t}{\partial z_{p3}} & -1 \end{pmatrix} * \begin{pmatrix} \Delta x \\ \Delta y \\ \Delta z \\ \Delta \tau \\ \Delta x_{p1} \\ \Delta y_{p1} \\ \Delta z_{p1} \\ \Delta \tau_{p1} \\ \Delta x_{p2} \\ \Delta y_{p2} \\ \Delta z_{py} \\ \Delta \tau_{p2} \\ \Delta x_{p3} \\ \Delta y_{p3} \\ \Delta z_{p3} \\ \Delta \tau_{p3} \end{pmatrix} = \begin{pmatrix} \Delta t - \Delta t_{p1} \\ \Delta t - \Delta t_{p2} \\ \Delta t - \Delta t_{p3} \end{pmatrix}$$

where x, y, and z are the estimated three-dimensional subsurface position of the seismic event, $\tau$ is the estimated origin time of the seismic event, $x_{p1}, y_{p1}, z_{p1},$ and $\tau_{p1}$ are the three-dimensional subsurface position and origin time of a first known source event, $x_{p2}, y_{p2}, z_{p2},$ and $\tau_{p2}$ are the three-dimensional subsurface position and origin time of a second known source event, $x_{p3}, y_{p3}, z_{p3},$ and $\tau_{p3}$ are the three-dimensional subsurface position and origin time of a third known source event, and t is the calculated travel time corresponding to the proposed location (position and origin time) of the seismic event.

Referring to Equation 2, it will be appreciated that the x, y, z, and $\tau$ may be updated in the column matrix in each iteration of the method 500, but the locations for the known source events are generally not updated. It will also be appreciated that the use of the picked arrival times in the final double difference calculation allows for the velocity correction properties of the double difference procedure. Each of the rows in the first matrix of Equation 2 takes the difference between the seismic event and one of the known source events when multiplied by the column matrix. For example, the first row of the first matrix of Equation 2 takes the difference between the seismic event and the first known source event, the second row of the first matrix of Equation 2 takes the difference between the seismic event and the second known source event, and the third row of the first matrix of Equation 2 takes the difference between the seismic event and the third known source event. The first matrix in the matrix equation and the right side column matrix of Equation 2 can be extended downward for each additional station, if needed.

Still referring to Equation 2, it will be appreciated that while the calculated travel time corresponding to the estimated location of the seismic event is iteratively updated/varied, the picked arrival time is not, as the picked arrival time is obtained from the seismic trace obtained at the sensors near the surface. However, because the general double difference equation (Equation 1 above) is defined as the difference between the picked arrival times minus the difference between the calculated travel times, the derivatives for the known source locations are each preceded by a minus sign—as the derivative of the constant, picked arrival time is zero.

Referring now to the method 600 illustrated in FIG. 6, another embodiment of locating a seismic event will be described. In operation 602, location information for a plurality of known source events proximate the seismic event is received. The known source events may be perforation shots, as described above. Further, the plurality of known source events may include one or more sets of events. For example, the plurality of known source events may include a first set of known source events associated with a first stage of perforating a hydraulic fracturing well, and a second set of known source events associated with a second stage of perforating the well.

In those embodiments where there are multiple known source events, or multiple sets of known source events, the method 500 may select the one or more known source events that are most likely closest to the seismic event to be located, or may interpolate between two or more known source events or sets of known source events if there are no known source events near enough to the seismic event. The selection may be based at least in part on trial-and-error—for example, a set of three perforation shots may be clustered together with the seismic event to be located, and a relative locator (see operation 604) may proceed. Subsequently, or at the same time, a different set of three perforation shots may be clustered together with the seismic event to be located, and the relative locator may proceed. Then, the results from both of these relative location efforts may be compared, and the one that has the smallest relative differences may be used, or, if the seismic events located using the two difference stages are not reasonably close, further analysis may be needed to resolve the discrepancy.

Referring still to FIG. 6, in operation 604, an estimated location of the seismic event is determined using a relative locator constrained by the location information for the plurality of known source events. The relative locator may be, for example, a double difference locator, and may operate by clustering the seismic event together with the known source events, as mentioned above. Similar to method 400, the estimated location determined in operation 604 may include an estimated origin time and an estimated three-dimensional subsurface position.

Tomography

Figure 7:
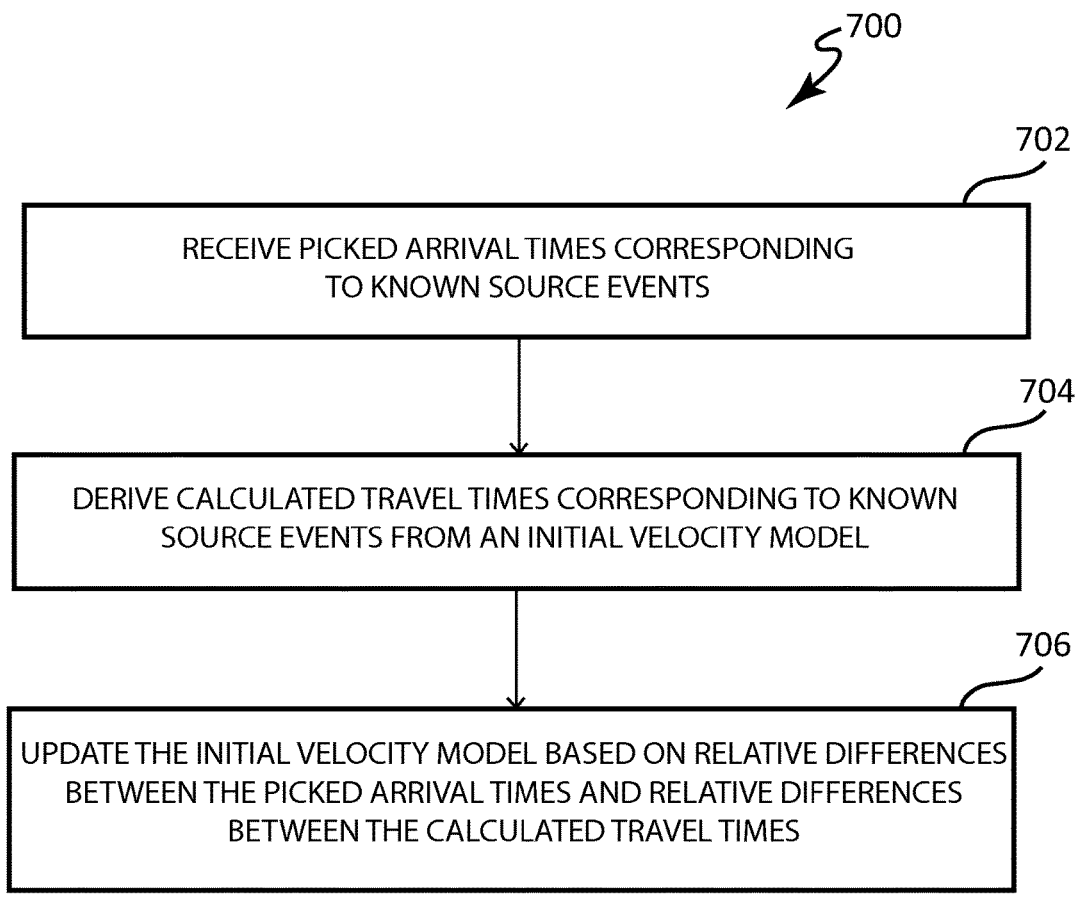
FIG. 7 is a flowchart illustrating an embodiment of a method of updating a velocity model.

Referring now to FIG. 7, embodiments for updating a velocity model will now be described. One or more of the embodiments described with reference to FIG. 7 may be implemented in the tomography program 323 shown in FIG. 3.

Generally speaking, FIG. 7 illustrates a method of using known source events together with a double difference tomography workflow to update a velocity model. The known source events are typically close together (relative to the distance between the source events and the sensor locations), and thus the ray paths from the known source events to the sensor locations are similar. Because the ray paths are similar, the difference between calculated and picked (or observed) travel times among the known source events will be a sensitive measure of any correction to the velocity model.

Turning now specifically to FIG. 7, in operation 702, a plurality of picked arrival times corresponding to a respective plurality of known source events are received. In some embodiments, at least some of the plurality of known source events may be perforation shots in a wellbore casing, whose three-dimensional subsurface position and origin time are known, as described above. Each of the known source events may be no further than 20 meters away from each of the other of the known source events in some embodiments, whereas in other embodiments, the known source events may be more than 20 meters apart from each other.

In operation 704, a plurality of calculated travel times corresponding to the plurality of known source events are derived from an initial velocity model. The initial velocity model may be based on a priori information about the area, such as previous seismic surveys, based on physical cores that have been obtained from the area, etc. In some embodiments, the "initial" velocity model may be an updated velocity model from a previous iteration of the method 700 illustrated in FIG. 7. The plurality of calculated travel times are generally derived from the initial velocity model because the velocity model determines the movement of the seismic waves generated by the known source events. More specifically, in some embodiments, the plurality of calculated travel times may be calculated with reference to a slowness field of the initial velocity model.

Generally speaking, each of the plurality of known source events may be associated with a known three-dimensional subsurface position and origin time, and the known three-dimensional subsurface position and origin time for each of the plurality of known source events may not be updated during the updating of the velocity model (as described below in operation 706). Each respective one of the plurality of calculated travel times corresponding to each respective one of the plurality of known source events may be calculated based on the known three-dimensional subsurface position and origin time for the respective one of the plurality of known source events and the initial velocity model. Thus while the known three-dimensional subsurface position and origin time for each of the plurality of known source events may not be updated (because the location of the sources, such as perforation shots, is fixed and does not change), the calculated travel times corresponding to the known source events may be updated as the velocity model is updated, as explained in more detail below.

In operation 706, the initial velocity model is updated based on relative differences between the plurality of picked arrival times and relative differences between the plurality of calculated travel times. The velocity model may be updated by iteratively adjusting the slowness field of the initial velocity model to reduce (e.g., minimize) a difference between the relative differences between the plurality of picked arrival times and the relative differences between the plurality of calculated travel times. For example, the following equation may be used to reduce the relative differences:

$$dr_k^{ij} = r_k^i - r_k^j = \int_i^k \delta u ds - \int_j^k \delta u ds \qquad \text{Equation 3}$$

where $dr_k^{ij}$ is the double difference, as described above, $\delta u$ is the shift in the slowness, which is integrated over the ray path (from event i to sensor location k, and from event j to sensor location k). It will be appreciated that Equation 3 does not include any terms involving variations in the event locations (position and origin time) because the position and origin time are known for each of the known source events. Thus, in contrast to previous double difference tomography approaches, Equation 3 only includes the terms related to the correction of the slowness for the segments along the relevant ray paths.

Referring now to operations 702, 704, and 706, in one example, an initial velocity model may be based on a priori information about a well, and operations 702 and 704 may proceed to receive the picked arrival times and to derive the calculated travel times. In operation 706, relative differences may be calculated, and these relative differences may determine how to update the velocity model (e.g., may control how the slowness field is adjusted). This new updated velocity model may then be used as the "initial" velocity model in a subsequent iteration of operations 702, 704, from which updated relative difference values will be generated, and can serve as the basis for further updating the velocity model in operation 706 again. Generally speaking, operations 702, 704, 706 may be repeated until a difference between the relative differences, or the change between successive iterations of the method 700 in such difference, is below a predetermined threshold.

In some embodiments, the updated velocity model obtained from operation 706 may be used to determine an estimated location of a seismic event (e.g., using any of the methods 400, 500, 600 illustrated in FIGS. 4, 5, and 6), and the determined location of the seismic event may be used to further update the velocity model. For example, if the located seismic event results in the expansion, contraction, or movement of a subsurface region, the velocity model of that subsurface region may need to be updated based on the seismic event.

As illustrated in FIGS. 1B through 1E, in some embodiments, a well may be perforated (and possibly fractured) in two or more stages. In these embodiments, the method 700 may be used to produce an updated velocity model after each stage—in order to, for example, understand how the reservoir changes as the stages progress. More specifically, in one embodiment, the plurality of known source events recited in operation 702 may be a first plurality of known source events triggered during a first stage of perforating a hydraulic fracturing well, for example, and the method 700 may proceed, during a second stage of perforating the hydraulic fracturing well, by receiving a second plurality of picked arrival times corresponding to a second plurality of known source events triggered during the second stage. A second plurality of calculated travel times corresponding to the second plurality of known source events may be derived from the updated initial velocity model from the first stage. The velocity model may then be further updated based on relative differences between the second plurality of picked arrival times and relative differences between the second plurality of calculated travel times.

Imaging

Figure 8:
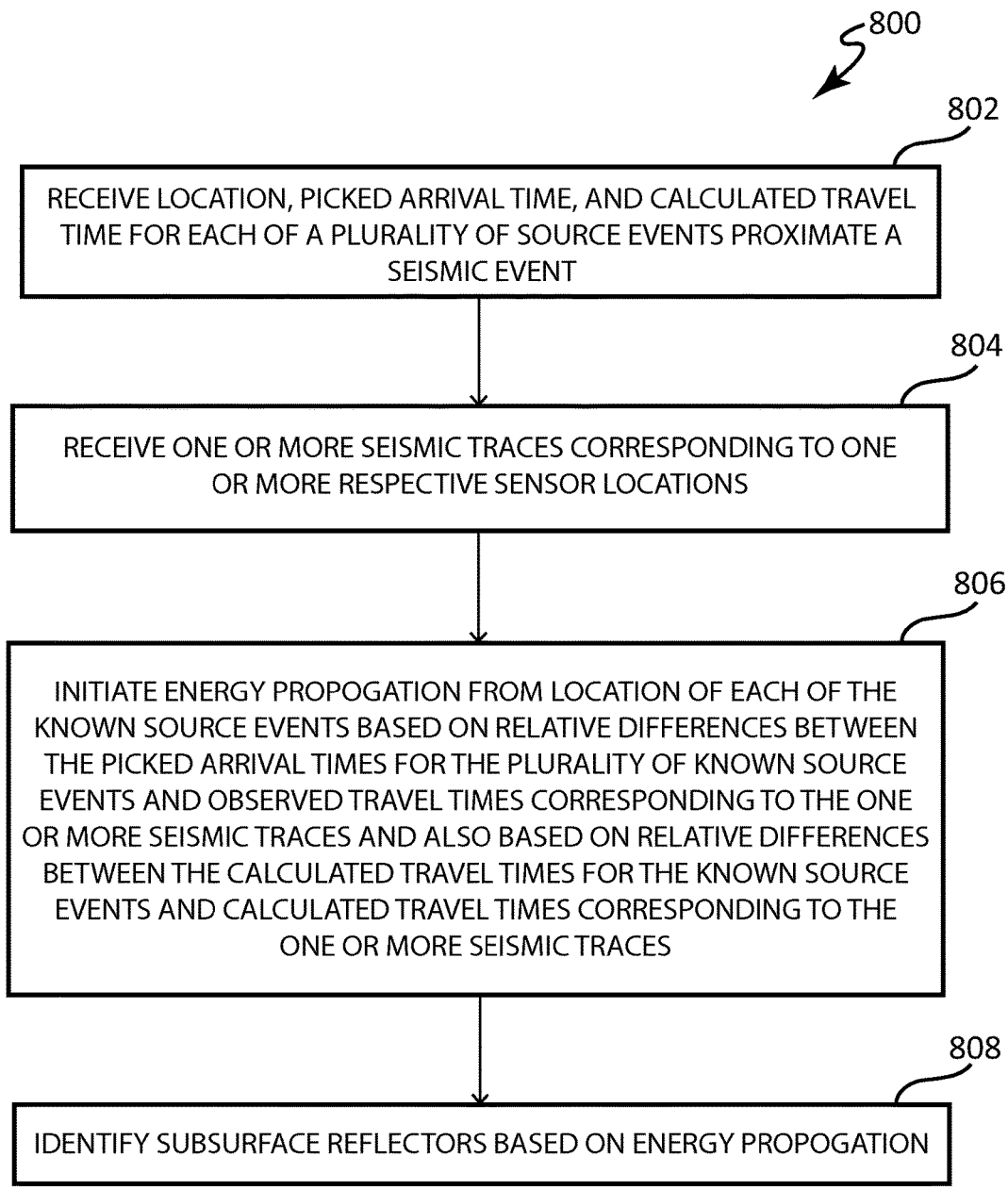
FIG. 8 is a flowchart illustrating an embodiment of a method of imaging a subsurface region.

Referring now to FIG. 8, embodiments for imaging a subsurface location will now be described. One or more of the embodiments described with reference to FIG. 8 may be implemented in the imaging program 324 shown in FIG. 3. Generally speaking the method 800 illustrated in FIG. 8 may use double difference locator techniques, together with known source locations from events such as perforation shots, to form an image of the subsurface. By using the known locations of the perforation shots and the refined travel time differences between the perforation shots and other seismic events (such as hydraulic fracturing events), the influence of the velocity model may be reduced and the resolution of the subsequent subsurface image may be increased.

The method 800 illustrated in FIG. 8 is thus one embodiment of imaging a subsurface region. In operation 802, a location, a picked arrival time, and a calculated travel time for each of a plurality of known source events proximate a seismic event are received. As described above, one or more of the known source events may be perforation shots. In some examples, however, the known source events may include at least four non-coplanar known source events. As such, while one or more of the plurality of known source events may be perforation shots, at least one or more of the known source events may be something other than a perforation shot, such as a seismic event (e.g., caused by hydraulic fracturing) whose location is known to within a predetermined certainty. For example, if the hydraulic fracturing of a well causes two very large fracturing events (which might be easily identified on the one or more seismic traces), those fracturing events may be used as two of the "known" source events. Alternatively, one or more perforation shots may be fired in the vertical portion of the well, which, while perhaps not needed for the hydraulic fracturing of the rock, may provide a known source event for use in the method 800 illustrated in FIG. 8.

In operation 804, one or more seismic traces corresponding to one or more sensor locations are received. The sensor location may be near an air-land boundary (e.g., one of the sensor locations 106 shown and described with reference to FIG. 1A), or near an air-water boundary (e.g., in an ocean-based towed-array seismic survey) in some embodiments. Furthermore, the sensor location may be distant from the seismic event and/or distant from the known source events in some examples. Each of the one or more seismic traces generally contain many seismic wave arrivals corresponding to seismic events, such as fracturing events and reflections of seismic waves traveling through the subsurface. In some embodiments, a location method (such as those illustrated in FIG. 4, 5, or 6) may be used to determine the location and origin time for one or more seismic events. The origin time may be subtracted from the arrival time to obtain a travel time for one or more of the arrivals in the one or more seismic traces.

In operation 806, energy propagation is initiated from the location of each respective one of the plurality of known source events based on relative differences between the picked arrival times for the plurality of known source events and observed travel times corresponding to the one or more seismic traces and/or based on relative differences between the calculated travel times for the plurality of known source events and calculated travel times corresponding to the one or more seismic traces. As described above, each of the one or more seismic traces may contain any number of arrivals of seismic waves. In some cases, these arrivals may be difficult to identify in isolation (because of, for example, a relatively low magnitude and/or because of background noise), but by migrating the seismic traces as described in operations 802 through 808, arrivals from multiple traces may work together to form an image of a subsurface reflector (with each reflection of a seismic wave from a subsurface reflector being, in a sense, a seismic event). In other words, while reflections of a seismic wave from a subsurface reflector may not be as strong as seismic events caused by, for example, the hydraulic fracturing of a well, multiple traces may be migrated per method 700 to form an image of the subsurface.

By initiating the energy propagation from the location of each of the known source events (as opposed to from the sensor locations near the surface), the known source event locations become pseudo sources in, for example, a Kirchhoff migration technique, whereby wave equation propagators, constrained by an estimated velocity model, can be used to propagate the energy from the known source locations. Thus, by using the calculated travel times for one or more seismic events together with the calculated travel times for the known source events to the sensor locations, the effect of errors in the velocity model may be diminished due to the similar ray paths to the sensor locations from both the seismic events and the known source events as a result of the double difference technique used to initiate the energy propagation. In other words, because the seismic events recorded in the one or more seismic traces generally occur near (e.g., within 1 meter, 10 meters, 50 meters, 100 meters, 500 meters, etc.) the known source events, errors in the velocity model (particularly near the surface and in between the surface and the seismic event and known source event locations, including in the water column for towed-array seismic surveys) may cancel out if the imaging process excludes the propagation of the seismic trace data over the common ray path traveled by waves generated by the known source event and the seismic event being imaged. Thus, instead of considering the total propagation time and path, only the differences between the source event and the seismic event being image are considered and used to control the differences in the forward propagation of energy from the known source event locations based on the seismic trace data.

In operation 808, subsurface reflectors may be identified based on the energy propagation initiated in operation 806. In some embodiments, the identifying may include imaging the subsurface reflectors. The subsurface reflectors may be identified by overlapping energy propagating from multiple ones of the plurality of known source events corresponding to signal recorded in the one or more seismic traces at the one or more sensor locations.

In the foregoing, reference is made to embodiments of the invention. However, it should be understood that the invention is not limited to specific described embodiments. Instead, any combination of the features and elements, whether related to different embodiments or not, is contemplated to implement and practice the invention. Thus while the apparatuses and associated methods in accordance with the present disclosure have been described with reference to particular embodiments thereof in order to illustrate the principles of operation, the above description is by way of illustration and not by way of limitation. Various modifications and alterations to the described embodiments will be apparent to those skilled in the art in view of the teachings herein. Those skilled in the art may, for example, be able to devise numerous systems, arrangements and methods which, although not explicitly shown or described herein, embody the principles described and are thus within the spirit and scope of this disclosure. As just one example, while the above disclosure has separately described several different methods 400, 500, 500, 700, 800 of processing seismic data using known source events, any of the acts or processes described with reference to one of the methods may be used in any of the other methods. Accordingly, it is intended that all such alterations, variations, and modifications of the disclosed embodiments are within the scope of this disclosure.

In methodologies directly or indirectly set forth herein, various steps and operations are described in one possible order of operation, but those skilled in the art will recognize that the steps and operations may be rearranged, replaced, or eliminated without necessarily departing from the spirit and scope of the disclosed embodiments. Further, all relative and directional references used herein are given by way of example to aid the reader's understanding of the particular embodiments described herein. They should not be read to be requirements or limitations, particularly as to the position, orientation, or use of the invention unless specifically set forth in the claims.

Furthermore, in various embodiments, the invention provides numerous advantages over the prior art. However, although embodiments of the invention may achieve advantages over other possible solutions and/or over the prior art, whether or not a particular advantage is achieved by a given embodiment is not limiting of the invention. Thus, the described aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

One embodiment of the invention is implemented as a program product for use with a computerized system. The program(s) of the program product defines functions of the embodiments (including the methods described herein) and can be contained on a variety of computer-readable media. Illustrative computer-readable media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a wireless network. The latter embodiment specifically includes information downloaded from the Internet and other networks. Such computer-readable media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the computer into a machine-readable format and hence executable instructions. Also, programs are comprised of variables and data structures that either reside locally to the program or are found in memory or on storage devices.

What is claimed is:

1. A method, comprising:
    activating one or more perforation shots, each perforation shot resulting in one or more seismic events;
    receiving a picked arrival time corresponding to a seismic event of the one or more seismic events;
    deriving a calculated travel time for a proposed location corresponding to the seismic event from a velocity model;
    determining a relative location for each of a plurality of known source events associated with the one or more perforation shots with respect to a respective seismic event;
    selecting a subset of known source events from the plurality of known source events based at least in part on the determined relative locations for each of the plurality of known source events;
    receiving a plurality of picked arrival times and a plurality of calculated travel times corresponding to the subset of known source events;
    determining an estimated location of the seismic event based at least in part on reducing a difference between:
        relative differences between the picked arrival time corresponding to the seismic event and the plurality of picked arrival times corresponding to the subset of known source events; and
        relative differences between the calculated travel time corresponding to the proposed location of the seismic event and the plurality of calculated travel times corresponding to the subset of known source events; and
    adjusting a location of one or more subsequent perforation shots based at least in part on the determined estimated location.

2. The method of claim 1, wherein each respective one of the plurality of known source events is a seismic source event with a respective known location.

3. The method of claim 2, further comprising determining each of the plurality of calculated travel times corresponding to each of the subset of known source events based on the respective known location of each respective known source event and the velocity model.

4. The method of claim 2, wherein the known location for each of the plurality of known source events is determined based on a position of a perforation source within a wellbore.

5. The method of claim 4, wherein the position of the perforation source within the wellbore is determined from a wireline.

6. The method of claim 2, wherein the respective known location of each respective one of the plurality of known source events includes a three-dimensional subsurface position and an origin time, and the three-dimensional subsurface position and origin time are known to within a specified accuracy.

7. The method of claim 1, wherein at least some of the plurality of known source events are perforation shots in a wellbore casing.

8. The method of claim 1, wherein the plurality of known source events comprises three or more perforation shots.

9. The method of claim 1, wherein reducing the difference comprises iteratively updating the proposed location corresponding to the seismic event.

10. The method of claim 9, wherein the proposed location corresponding to the seismic event is iteratively updated until a change between successive iterations of said difference is less than a predetermined threshold.

11. The method of claim 9, wherein the proposed location corresponding to the seismic event is iteratively updated until said difference is reduced to below a predetermined threshold.

12. The method of claim 1, wherein the picked arrival time corresponding to the seismic event at the sensor location is received in near-real time, and the estimated location of the seismic event is determined in near-real time.

13. The method of claim 12, wherein the picked arrival time is one of a plurality of picked arrival times and the seismic event is one of a plurality of seismic events, and the estimated location of the one of the plurality of seismic events is determined without reference to the picked arrival times for others of the plurality of seismic events.

14. A method, comprising:
    activating one or more perforation shots, each perforation shot resulting in one or more seismic events;
    determining a relative location for each of a plurality of known source events associated with the one or more perforation shots with respect to a respective seismic event;
    selecting a subset of known source events from the plurality of known source events based at least in part on the determined relative locations for each of the plurality of known source events; and
    determining an estimated location of a seismic event using a relative locator constrained by location information for the subset of known source events based at least in part on reducing a difference between:
        relative differences between the picked arrival time corresponding to the seismic event and the plurality of picked arrival times corresponding to the subset of known source events; and
        relative differences between the calculated travel time corresponding to the proposed location of the seismic event and the plurality of calculated travel times corresponding to the subset of known source events; and
    adjusting a location of one or more subsequent perforation shots based at least in part on the determined estimated location.

15. The method of claim 14, wherein the relative locator is a double difference locator.

16. The method of claim 14, further comprising clustering the seismic event together with the subset of known source events for use by the relative locator.

17. The method of claim 14, wherein the estimated location of the seismic event includes an estimated origin time and an estimated three-dimensional subsurface position.

18. The method of claim 14, wherein the plurality of known source events comprises a first set of known source events associated with a first stage of perforating a hydraulic fracturing well and a second set of known source events associated with a second stage of perforating a hydraulic fracturing well.

19. The method of claim 18, further comprising determining the estimated location of the seismic event by interpolating between the first and second sets of known source events.

20. A method of visualizing a seismic event, comprising:
receiving a plurality of picked arrival times corresponding to a respective plurality of known source events;
determining a relative location for each of the plurality of known source events with respect to a respective seismic event;
selecting a subset of known source events from the plurality of known source events based at least in part on the determined relative locations for each of the plurality of known source events;
deriving a plurality of calculated travel times corresponding to the subset of known source events from an initial velocity model, wherein the plurality of calculated travel times are calculated with reference to a slowness field of the initial velocity model, and the initial velocity model is updated by iteratively adjusting the slowness field to reduce a difference between (a) relative differences between the plurality of picked arrival times and (b) the relative differences between the plurality of calculated travel times;
updating the initial velocity model based on relative differences between the plurality of picked arrival times and relative differences between the plurality of calculated travel times;
displaying the seismic event based at least in part on the updated initial velocity model.

21. The method of claim 20, wherein at least some of the plurality of known source events are perforation shots in a wellbore casing, whose three-dimensional subsurface position and origin time are known.

22. The method of claim 20, wherein each of the plurality of known source events is no further than 20 meters away from each of the other of the plurality of known source events.

23. The method of claim 20, wherein each of the plurality of known source events is associated with a known three-dimensional subsurface position and origin time, and the known three-dimensional subsurface position and origin time for each of the plurality of known source events are not varied during said updating.

24. The method of claim 23, wherein each respective one of the plurality of calculated travel times corresponding to each respective one of the plurality of known source events is calculated based on the known three-dimensional subsurface position and origin time for the respective one of the plurality of known source events and the initial velocity model.

25. The method of claim 20, further comprising determining an estimated location of a seismic event using the updated velocity model.

26. The method of claim 25, further comprising further updating the velocity model based on the determined location of the seismic event.

27. The method of claim 20, wherein the plurality of known source events is a first plurality of known source events triggered during a first stage of perforating a hydraulic fracturing well, further comprising:
receiving a second plurality of picked arrival times corresponding to a second plurality of known source events triggered during a second stage of perforating a hydraulic fracturing well;
deriving a second plurality of calculated travel times corresponding to the second plurality of known source events; and
further updating the velocity model based on relative differences between the second plurality of picked arrival times and relative differences between the second plurality of calculated travel times.

28. A method of imaging a subsurface region, comprising:
receiving a location, a picked arrival time, and a calculated travel time for each of a plurality of known source events;
determining a relative location for each of the plurality of known source events with respect to a respective seismic event;
selecting a subset of known source events from the plurality of known source events based at least in part on the determined relative locations for each of the plurality of known source events;
receiving one or more seismic traces corresponding to a sensor location;
initiating energy propagation from the location of each respective one of the subset of known source events based on relative differences between the picked arrival times for the subset of known source events and observed travel times corresponding to the one or more seismic traces and also based on relative differences between the calculated travel times for the subset of known source events and calculated travel times corresponding to the one or more seismic traces; and
identifying subsurface reflectors based on said energy propagation, wherein the subsurface reflectors are identified by overlapping energy propagating from multiple ones of the subset of known source events, wherein at least a first of the subset of known source events is a perforation shot.

29. The method of claim 28, wherein said identifying comprises imaging said subsurface reflectors.

30. The method of claim 28, wherein the sensor location is near an air-land or air-water boundary, the sensor location is distant from the seismic event, and the sensor location is distant from each of the plurality of known source events.

31. The method of claim 28, wherein at least a second of the subset of known source events is a seismic event whose location is known to within a specified certainty.

32. The method of claim 28, wherein said energy propagation is done using a Kirchhoff migration technique.

33. The method of claim 28, wherein energy in the one or more seismic traces is propagated using wave equation propagators.

34. The method of claim 28, wherein an estimated velocity model constrains said energy propagation.

35. The method of claim 28, wherein the plurality of known source events includes at least four non-coplanar known source events.

* * * * *